(12) United States Patent
He

(10) Patent No.: US 11,799,264 B2
(45) Date of Patent: Oct. 24, 2023

(54) LASER FREQUENCY MODULATION METHOD AND DEVICE, STORAGE MEDIUM, AND LASER DEVICE

(71) Applicant: SUTENG INNOVATION TECHNOLOGY CO., LTD., Shenzhen (CN)

(72) Inventor: Yixiong He, Shenzhen (CN)

(73) Assignee: SUTENG INNOVATION TECHNOLOGY CO., LTD., Shenzhen (CN)

( * ) Notice: Subject to any disclaimer, the term of this patent is extended or adjusted under 35 U.S.C. 154(b) by 122 days.

(21) Appl. No.: 17/693,510

(22) Filed: Mar. 14, 2022

(65) Prior Publication Data

US 2022/0200230 A1 Jun. 23, 2022

Related U.S. Application Data

(63) Continuation of application No. PCT/CN2019/108161, filed on Sep. 26, 2019.

(51) Int. Cl.
*G01C 3/08* (2006.01)
*H01S 3/139* (2006.01)
*G01S 17/34* (2020.01)

(52) U.S. Cl.
CPC .............. *H01S 3/139* (2013.01); *G01S 17/34* (2020.01)

(58) Field of Classification Search
None
See application file for complete search history.

(56) References Cited

U.S. PATENT DOCUMENTS

| 11,650,316 B1* | 5/2023 | Rezk ....................... G01S 17/58 356/3 |
| 2006/0153253 A1* | 7/2006 | Diffily ................. H01S 5/06256 372/29.02 |
| 2016/0372890 A1* | 12/2016 | Minneman ............ H01S 5/1092 |

FOREIGN PATENT DOCUMENTS

| CN | 106597468 A | 4/2017 |
| CN | 110048303 A | 7/2019 |

OTHER PUBLICATIONS

O'Connor et al, "Generation of High Speed, Linear Wavelength Sweeps Using Sampled Grating Distributed Bragg Reflector Lasers", Sep. 2008, IEEE, pp. 147-148 (Year: 2008).*
International Search Report dated Jun. 23, 2020 in the patent application PCT/CN2019/108161, 5 pages.
European Search Report issued in related European Application No. EP19946526.1, dated Jun. 21, 2022, 9 pages.

* cited by examiner

*Primary Examiner* — Mark Hellner
(74) *Attorney, Agent, or Firm* — BAYES PLLC

(57) ABSTRACT

Embodiments of this application disclose a laser frequency modulation method and device, a storage medium, and a laser device. The method includes: obtaining the current sweep mode of the laser device in a timing manner; when the current sweep mode is the single-band sweep mode, controlling the laser device to perform continuous sweeping on the preset band; and when the current sweep mode is the multi-band switching mode, obtaining the next band for the laser device to perform sweeping, and controlling the laser device to switch from the band to the next band.

4 Claims, 14 Drawing Sheets

LASER FREQUENCY MODULATION METHOD AND DEVICE, STORAGE MEDIUM, AND LASER DEVICE

CROSS-REFERENCE TO RELATED APPLICATION

The present application is a continuation of International Application No. PCT/CN2019/108161, filed on Sep. 26, 2019, which is incorporated herein by reference in its entirety.

TECHNICAL FIELD

This application relates to the field of computer technologies, and in particular, to a laser frequency modulation method and device, a storage medium, and a laser device.

BACKGROUND

LiDAR is widely applied in fields such as automated driving, robots, and aerial mapping due to its features of long detection range and high ranging precision.

Based on working modes of lasers at a transmitting end, LiDAR can be classified into pulse LiDAR and continuous-wave LiDAR. Frequency modulated continuous wave (FMCW) LiDAR pertains to a continuous-wave LiDAR based on coherent detection. A main principle of the FMCW LiDAR is as follows. Continuous waves whose transmitting frequency changes linearly in a sweep period serve as outgoing signals, some outgoing signals serve as local-frequency signals, and the others are emitted outward for detection. There is some frequency difference between echo signals returned after being reflected by an object and the local-frequency signals. Information about a distance between the object and the LiDAR can be obtained by measuring the frequency difference. To implement this sweep process, a light source is required for scanning continuous frequency, and a sweep range is usually within a relatively small range (for example, from hundreds of megahertz to scores of gigahertz).

In addition, existing scanning methods of LiDAR are mainly classified into mechanical scanning, Micro-Electro-Mechanical System (MEMS) mirror scanning, and optical phased array (OPA) scanning. A basic principle of OPA scanning is as follows. Beams are divided into multiple-array transmitting antennas through a beam splitter. If a phase difference between optical signals is zero, an equal-phase plane of the outgoing light is parallel to the transmitting antennas, and light waves are emitted outward perpendicular to the transmitting antennas without beam deflection.

The FMCW detection principle and OPA scanning require different sweep methods, and therefore, are difficult to apply or combine in LiDAR.

SUMMARY

Embodiments of this application provide a laser frequency modulation method and device, a storage medium, and a laser device, to meet application needs of both FMCW detection principles and OPA scanning, which is of great significance for applying both FMCW and OPA technologies to a LiDAR system. Technical solutions are as follows.

According to a first aspect, an embodiment of this application provides a laser frequency modulation method, where the method includes: obtaining a current sweep mode of a laser device in a timing manner; when the current sweep mode is a single-band sweep mode, controlling the laser device to perform continuous sweeping on a preset band; and when the current sweep mode is a multi-band switching mode, obtaining a next band for the laser device to perform sweeping, and controlling the laser device to switch from the band to the next band.

The laser device is alternately switched between the two modes through timing control, to control the laser device to perform sweeping band-by-band on multiple preset bands.

According to a second aspect, an embodiment of this application provides a laser frequency modulation device, where the device includes: a timing module, configured to obtain a current sweep mode of a laser device in a timing manner; a single-band sweep module, configured to: when the current sweep mode is a single-band sweep mode, control the laser device to perform continuous sweeping on a preset band; and a multi-band switching module, configured to: when the current sweep mode is a multi-band switching mode, obtain a next band for the laser device to perform sweeping, and control the laser device to switch from the band to the next band.

According to a third aspect, an embodiment of this application provides a computer storage medium, where the computer storage medium stores a plurality of instructions, and the instructions are capable of being loaded by a processor to perform the forgoing laser frequency modulation method.

According to a fourth aspect, an embodiment of this application provides a laser device, including a processor and a memory, where the memory stores a computer program, and the computer program is capable of being loaded by the processor to perform the forgoing laser frequency modulation method.

The beneficial effects of the technical solutions in some embodiments of this application include at least the following:

In one or more embodiments of this application, the current sweep mode of the laser device is obtained; when the current sweep mode is a single-band sweep mode, the laser device is controlled to perform continuous sweeping on the preset band; and when the current sweep mode is a multi-band switching mode, the next band is obtained for the laser device to perform sweeping, and the laser device is controlled to switch from the band to the next band. Sweeping is performed band-by-band on multiple preset bands under joint action of the two modes. In this application, a new laser frequency modulation method (multi-band linear sweep) is designed, where the laser device performs continuous linear sweeping on a single band within a relatively small frequency range, to meet a requirement of the FMCW system for detecting a distance from a transmitting end; and the laser device switches between multiple bands, to implement relatively great frequency switching, so that an OPA can implement a relatively large scanning angle, to meet a requirement of an OPA system for implementing spatial scanning through frequency modulation. This can meet both an FMCW detection principle and an application requirement of OPA scanning, and is of great significance for applying both FMCW and OPA technologies to a LiDAR system. Therefore, completely solid-state LiDAR can be implemented, and a transceiver and a scanning device are easy to integrate.

BRIEF DESCRIPTION OF DRAWINGS

To explain embodiments of the present disclosure or technical solutions in the prior art more clearly, the following briefly introduces the drawings required to describe the embodiments or the prior art. Obviously, the drawings in the following descriptions are only some embodiments of the present disclosure. A person of ordinary skill in the art may still derive other drawings from these drawings without creative efforts.

DESCRIPTION OF EMBODIMENTS

The following clearly and completely describes the technical solutions in the embodiments of this application with reference to the drawings in the embodiments of this application. Obviously, the described embodiments are only some but not all of the embodiments of this application. All other embodiments obtained by a person of ordinary skill in the art based on the embodiments of this application without creative efforts shall fall within the protection scope of this application.

In the descriptions of this application, it should be understood that the terms such as "first" and "second" are merely intended for description, and should not be understood as an indication or implication of relative importance. In the descriptions of this application, it should be understood that "include," "have," or any other variant thereof are intended to cover a non-exclusive inclusion unless otherwise specified and defined explicitly. For example, a process, a method, a system, a product, or a device that includes a series of steps or units is not limited to the listed steps or units, but optionally further includes an unlisted step or unit, or optionally further includes another inherent step or unit of the process, the method, the system, the product, or the device. The person skilled in the art can understand specific meanings of the foregoing terms in this application to a specific situation. In addition, in the descriptions of this application, "a plurality of" means two or more unless otherwise specified. Herein, "and/or" is an association relationship for describing associated objects and indicates that three relationships may exist. For example, A and/or B may mean the following three cases: only A exists, both A and B exist, and only B exists. The character "/" generally indicates an "or" relationship between the associated objects.

The following describes a laser frequency modulation method according to this embodiment of this application in detail with reference to specific embodiments. The method may be implemented by a computer program capable of running on a laser frequency modulation device based on the von Neumann architecture. The computer program can be integrated into an application or run as an independent tool application. Herein, the laser frequency modulation device in this embodiment of this application may be a laser device, and the laser device is a frequency modulation laser device.

Figure 1:
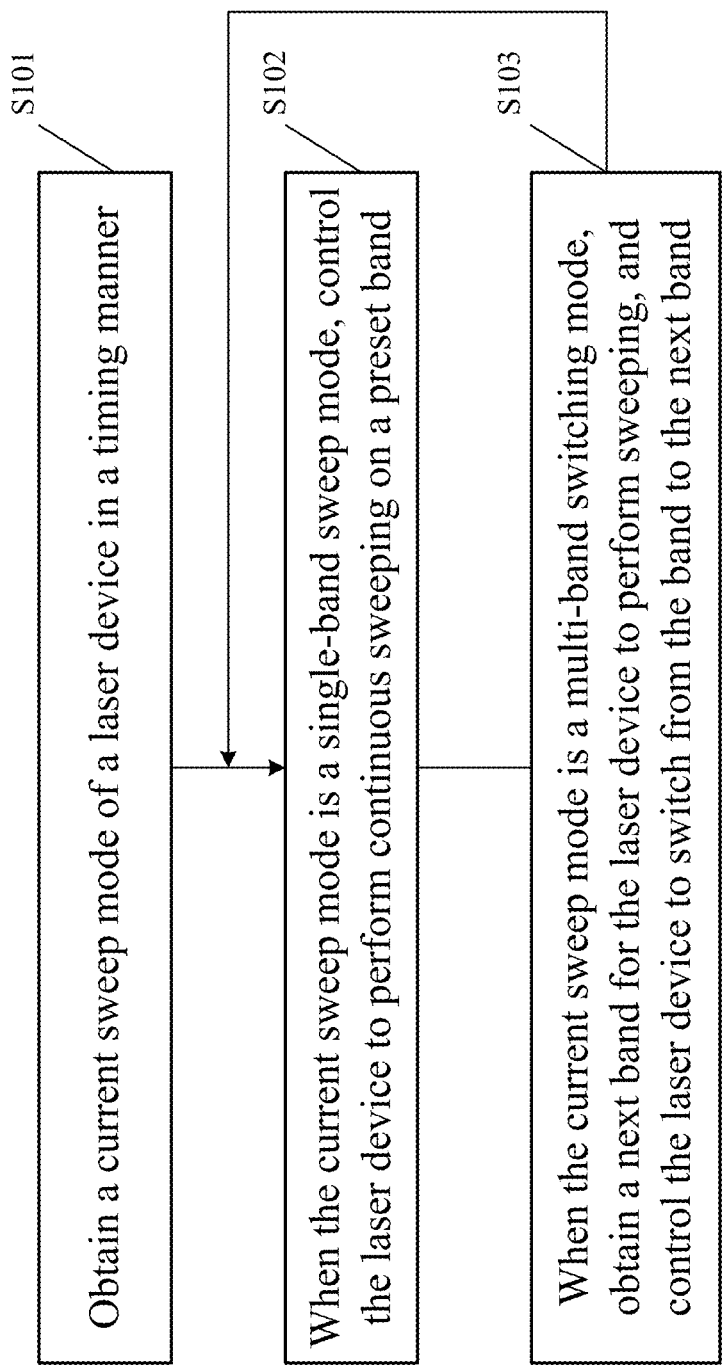
FIG. 1 is a schematic flowchart of a laser frequency modulation method according to an embodiment of this application.

FIG. 1 is a schematic flowchart of a laser frequency modulation method according to an embodiment of this application. As shown in FIG. 1, the method in this embodiment of this application may include the following steps:

S101. Obtain a current sweep mode of a laser device in a timing manner.

A laser device is a device capable of emitting a laser. A modulated laser device refers to a laser device for outputting a laser that can be adjusted as required, and modulated laser devices may be classified into a power-tunable laser device and a frequency modulation laser device based on an adjusted laser parameter.

Herein, the frequency modulation laser device is a laser device for emitting continuous waves, and frequency modulation laser devices can be classified into two categories: external modulated and internal modulated laser devices. The external modulated laser device is provided with a dedicated signal interface, and a user inputs a signal. The signal may be a triangular wave, a sawtooth-shaped wave, or the like, and a modulated frequency may reach 10 MHz. The internal modulated laser device does not need an external signal. Under a working voltage, the laser device works in a continuous-wave mode with working frequency designed as required.

In this embodiment of this application, the laser device is a frequency modulation laser device, and has different sweep modes to meet sweep requirements of different systems.

For example, a LiDAR system uses an FMCW (Frequency Modulated Continuous Wave, FMCW) ranging principle. Therefore, some devices meeting the FMCW ranging principle need to be selected. For example, a transmitting end uses a frequency modulated continuous wave laser device, and a frequency modulated continuous wave LiDAR is used for a LiDAR system. The frequency modulated continuous wave LiDAR pertains to continuous-wave LiDAR based on coherent detection. A basic principle of the FMCW LiDAR is as follows. Continuous waves whose transmitting frequency changes linearly in a sweep period serve as outgoing signals, some outgoing signals serve as local-frequency signals, and the others are emitted outward for detection. There is some frequency difference between echo signals returned after being reflected by an object and the local-frequency signals. Information about a distance between the object and the LiDAR can be obtained by measuring the frequency difference. In the FMCW LiDAR, a light source with a continuously changing frequency is required, and a sweep range is usually from hundreds of megahertz to scores of gigahertz. Generally, the triangular wave is used for modulation, and the modulated frequency usually ranges from 10 kHz to 100 kHz. In addition, the FMCW LiDAR has a relatively high requirement for continuity and linearity of an outgoing signal, so that the difference between the local-frequency signal and the echo signal is stable, avoiding generation of another variable due to a nonlinear change of a waveform. Usually, a current-modulated distributed feedback (DFB) semiconductor laser device and an external cavity diode laser (ECDL) device are configured to perform sweeping.

Figure 2:
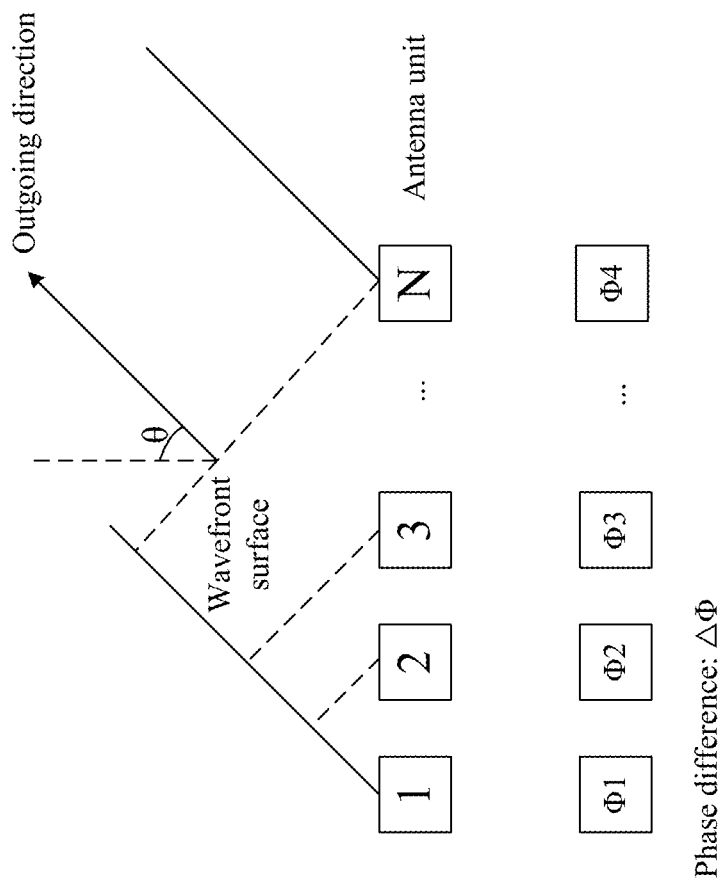
FIG. 2 is an example schematic diagram of an outgoing plane of beam transmission according to an embodiment of this application.

In addition, as for an optical phased array (OPA) scanning system, its basic principle is that an outgoing signal is split by a beam splitter into a plurality of beams and then emitted outward through a transmitting antenna array. If a phase difference between outgoing signals is zero, an equal-phase plane of the outgoing signals is parallel to the transmitting antenna array, and the plurality of outgoing signals are emitted perpendicular to the transmitting antenna array without deflection in an outgoing direction. If an equal phase difference of $\Delta\phi$ is added to each outgoing signal, then the equal-phase plane of the outgoing signals and the transmitting antenna array form an angle of $\theta$, the outgoing signals are emitted outward perpendicular to the equal-phase plane, and are deflected by the angle of $\theta$ relative to a direction perpendicular to the transmitting antenna array. As shown in FIG. 2, changing the phase difference of $\Delta\phi$ can change $\theta$, thereby implementing a scanning effect of the outgoing signals. The LiDAR using OPA scanning can change frequency of the outgoing lasers, to change the phase difference of $\Delta\phi$, thereby implementing scanning of an outgoing beam. Therefore, the frequency modulation laser device can be widely applied to such OPA scanning. In the LiDAR using OPA scanning, the larger the scanning angle achievable for the OPA is, the higher the requirement for the frequency modulation range of the laser device is. For example, to achieve a scanning range of 40° in a dimension, a frequency modulation range of the outgoing signal emitted by the laser device needs to be greater than 12.5 THz, but no high requirement is imposed on continuity and linearity concerning frequency modulation of the outgoing signal.

Specifically, a rated working current is supplied to the laser device, so that the laser device normally emits light to initiate the frequency-modulated laser device. Then the laser device is initialized. Specifically, a working condition of the laser device is initialized, and current values of a plurality of ports of the laser device are controlled, so that the laser device works on an initial band. The laser device starts working on the initial band in the sweep mode.

Sweep modes include a single-band sweep mode and a multi-band switching mode. In different sweep modes, a module included in the laser device is controlled in different manners, to separately meet a frequency modulation requirement of an FMCW system and a frequency modulation requirement of an OPA system.

In a feasible embodiment, the current sweep mode of the laser device can be obtained in a timing manner. Specifically, the laser device may include a control chip, and the control chip outputs a drive current signal based on set timing, thereby changing a working mode. That is, at a specific moment, the control chip automatically drives the laser device to work in a specific sweep mode, or at another moment, then the control chip drives the laser device to work in another sweep mode. The current sweep mode depends on timing corresponding to the current moment.

S102. When the current sweep mode is a single-band sweep mode, control the laser device to perform continuous sweeping on a preset band.

When the current sweep mode is the single-band sweep mode, the laser device is controlled to keep the operating band as the current band, and perform continuous linear sweeping on the current band. Herein, a sweep carrier may be a triangular wave, a sawtooth-shaped wave, or the like. When there is a relatively high requirement for linearity, the triangle wave or the sawtooth-shaped wave is frequently used.

Figure 3:
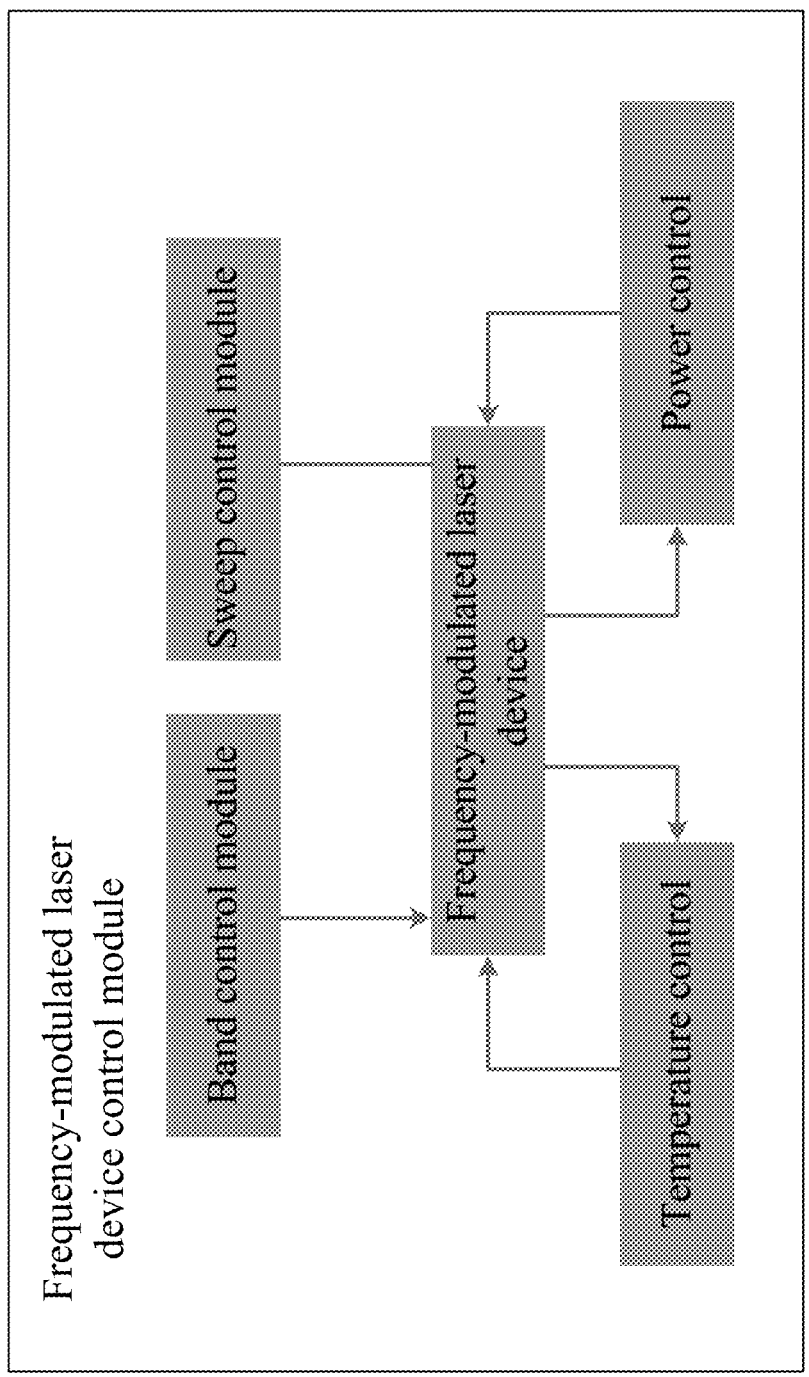
FIG. 3 is a schematic structural diagram of a frequency-modulated laser device according to an embodiment of this application.

It should be noted that a structure of the laser device is shown in FIG. 3, and includes a band control module, a sweep control module, temperature control, and power control. The band control module can implement jumping of the working band in a wide range, the sweep control module can implement continuous linear sweep in a small range, the temperature control module ensures constant temperature of the laser device and avoids warm-up drift (frequency of the outgoing signal of the laser device changes along with temperature), and the power control ensures constant output power of the laser device. In the single-band sweep mode, the band control module keeps the working band of the laser device unchanged, and the sweep control module controls the laser device to perform continuous linear sweeping in a small range.

S103. When the current sweep mode is a multi-band switching mode, obtain a next band for the laser device to perform sweeping, and control the laser device to switch from the band to the next band.

Specifically, when the current sweep mode is the multi-band switching mode, the laser device traverses each band in the plurality of preset bands, and is controlled to switch the working band of the laser device from a current traversed target band to the next band, suspend continuous scanning, and switch to another band in the same manner.

The structure of the laser device is shown in FIG. 3. In the multi-band switching mode, the band control module implements band switching for the laser device, and the sweep control module suspends continuous sweeping. A speed of band switching is very high, and usually reaches a microsecond scale.

The frequency-modulated laser device is enabled to work alternately in two modes through the timing control, to perform sweeping band-by-band on a plurality of preset bands, thereby meeting both the FMCW detection principle and an application requirement of OPA scanning.

Figure 4:
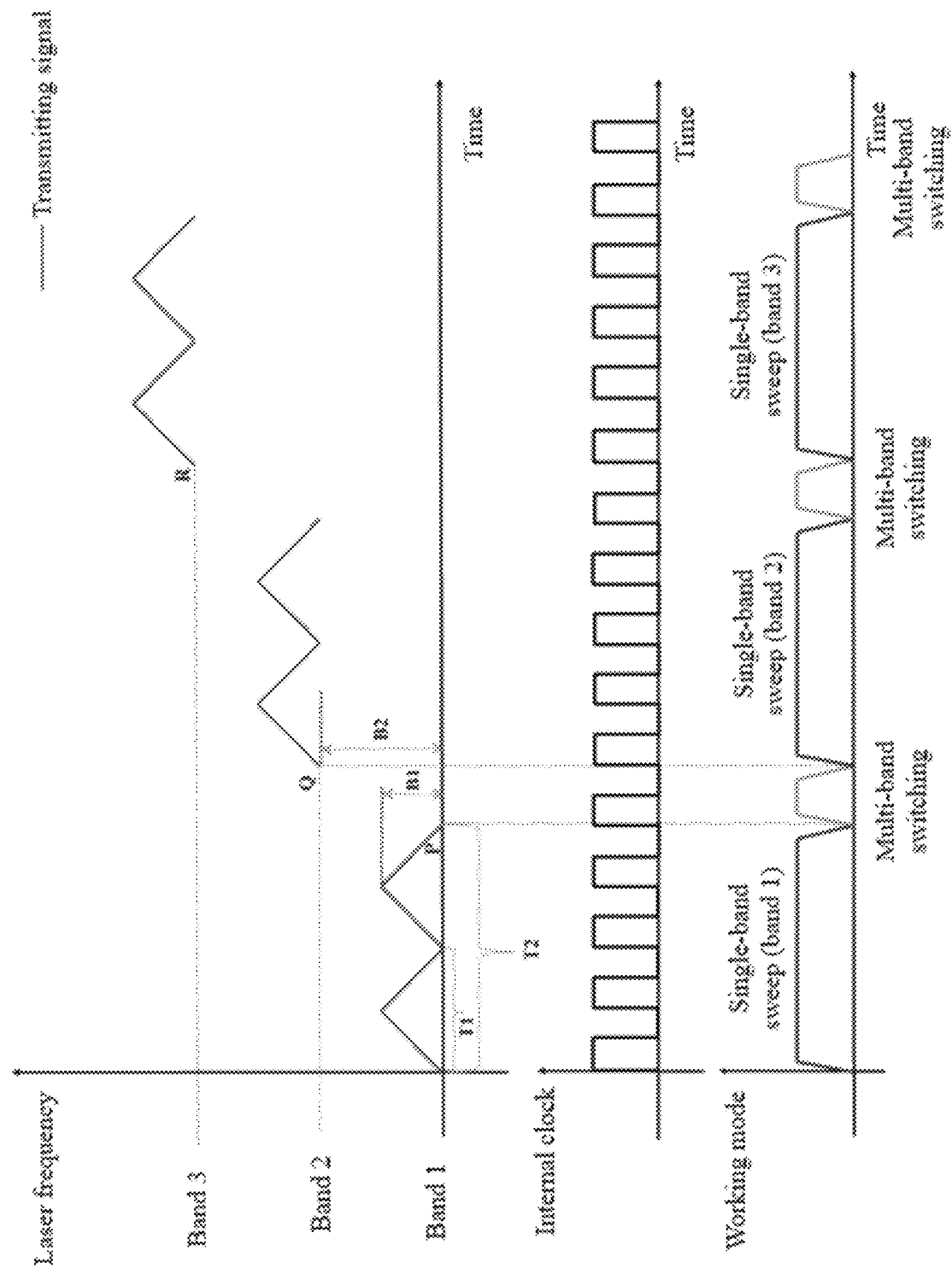
FIG. 4 is an example schematic diagram of a multi-band sweep effect according to an embodiment of this application.

For example, as shown in FIG. 4, the laser device includes three working bands: band 1, band 2, and band 3. First, working frequency of the laser device is controlled to remain on the band 1, and perform linear sweeping within this band through triangular waves, where a period is T1, and a sweep bandwidth is B1. After two sweep periods (T2=2*T1), the working band of the laser device is adjusted, so that the working frequency jumps to the band 2; and then the laser device performs sweeping in the same manner. Similarly, after sweeping on the band 2 is completed, the working frequency jumps to the band 3 for sweeping. Bandwidth between the band 1, the band 2, and the band 3 is B2, and B2>B1.

It can be understood that the plurality of preset bands refer to a plurality of working bands covered based on a need of actual use. For example, a specific laser device can cover a total of 103 working bands (channels): 191.15 THz, 191.2 THz, 191.25 THz, 191.3 THz, . . . , and 196.15 THz. Then, the bands are respectively 191.15 THz, 191.2 THz, 191.25 THz, 191.3 THz, . . . , and 196.15 THz, a corresponding frequency modulation range is 191.15 THz to 196.15 THz (1528.38 nm to 1568.38 nm), and a space between working bands is 50 GHz (with a wavelength space of 0.4 nm).

In one or more embodiments of this application, the current sweep mode of the laser device is obtained; when the current sweep mode is a single-band sweep mode, the laser device is controlled to perform continuous sweeping on the preset band; and when the current sweep mode is a multi-band switching mode, the next band is obtained for the laser device to perform sweeping, and the laser device is controlled to switch from the band to the next band. Sweeping is performed band-by-band on multiple preset bands under joint action of the two modes. In this application, a new laser frequency modulation method (multi-band linear sweep) is designed, where the laser device performs continuous linear sweeping on a single band within a relatively small frequency range, to meet a requirement of the FMCW system for detecting a distance from a transmitting end; and the laser device switches between multiple bands, to implement relatively great frequency switching, so that an OPA can implement a relatively large scanning angle, to meet a requirement of an OPA system for implementing spatial scanning through frequency modulation. This can meet both an FMCW detection principle and an application requirement of OPA scanning, and is of great significance for applying both FMCW and OPA technologies to a LiDAR system. Therefore, when using the FMCW detection principle and the OPA scanning, the LiDAR can be completely solid-state, and a transceiver and a scanning device are easy to integrate.

Figure 5:
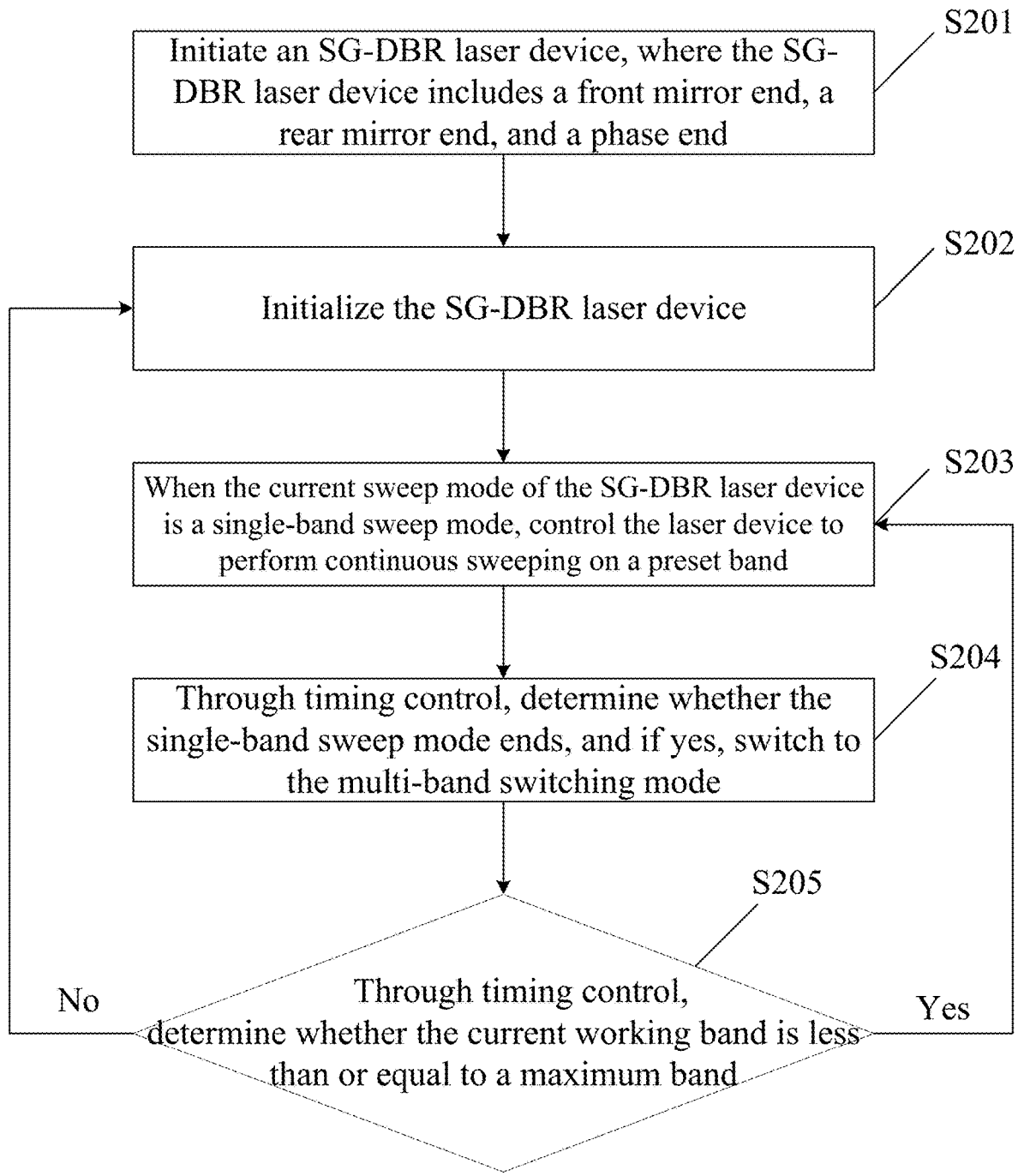
FIG. 5 is a schematic flowchart of a laser frequency modulation method according to an embodiment of this application.

FIG. 5 is a schematic flowchart of a laser frequency modulation method according to an embodiment of this application. In this embodiment, an example in which the laser frequency modulation method is applied to a sampled grating distributed Bragg reflector (SG-DBR) laser device is used for description. The laser frequency modulation method may include the following steps:

S201. Initiate an SG-DBR laser device, where the SG-DBR laser device includes a front mirror end, a rear mirror end, and a phase end.

The laser device is a SG-DBR semiconductor laser device.

Figure 6:
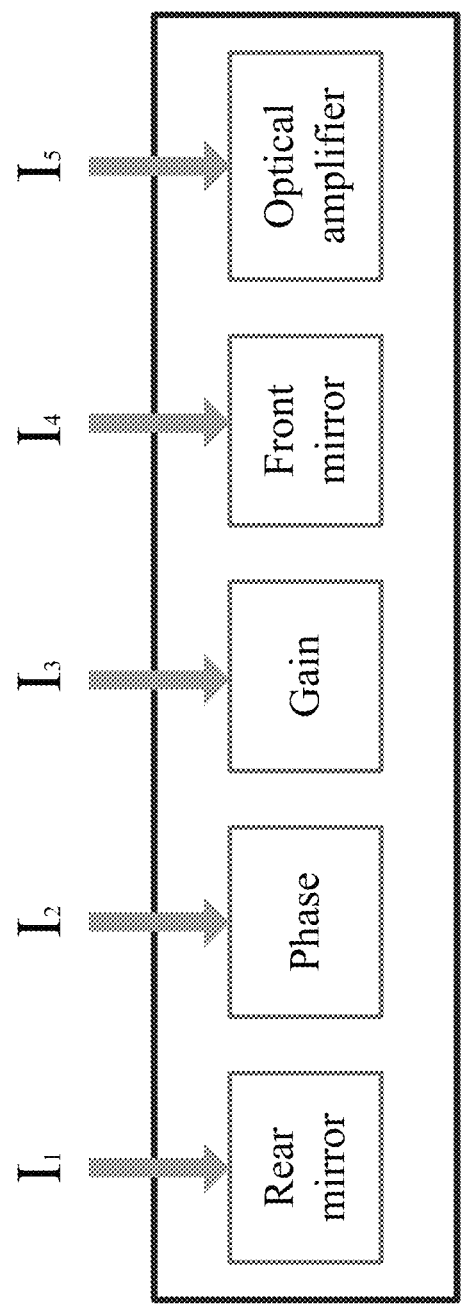
FIG. 6 is a schematic structural diagram of a main module of an SG-DBR semiconductor laser device according to an embodiment of this application.

An entire current control module of the SG-DBR semiconductor laser device is shown in FIG. 6, and includes a rear mirror end, a phase end, a gain end, a front mirror end, and an optical amplifier end. The front mirror end, the rear mirror end, and the phase end work in a high-bandwidth mode with a current I4, a current I1, and a current I2, to control output frequency of the laser device at a high speed. The gain end and the optical amplifier end work in a low-bandwidth mode with a current I3 and a current I5, to control the output power of the laser device. Therefore, the entire module modulates frequency and power for the outgoing signal. For the SG-DBR laser device, the front mirror and the rear mirror include Bragg gratings of different periods, and an overlapped part of transmittance peaks of the two gratings is the output frequency of the laser device. Controlling the currents I4 and I1 of the front and rear mirrors can change a refractive index of the two Bragg gratings, thereby changing the period of the Bragg gratings and finally implementing laser frequency modulation.

The current I2 of the phase end is controlled by modulating a phase modulator in a resonant cavity, to change the frequency in a small range, a frequency modulation range is less than 50 GHz, and a modulation change is usually 1 GHz/mA, thereby implementing high-precision continuous modulation. Herein, a cavity between the front mirror and the rear mirror forms the resonant cavity of the laser device.

Maintaining a current value of the front mirror and the rear mirror and modulating a current of the phase end (analog signal) can implement small-scale continuous linear sweeping, thereby meeting a requirement for the outgoing signal under the FMCW detection principle.

The SG-DBR laser device can cover a total of 103 working bands: 191.15 THz, 191.2 THz, 191.25 THz, 191.3 THz, . . . , and 196.15 THz. A corresponding frequency modulation range is 191.15 THz to 196.15 THz (1528.38 nm to 1568.38 nm), and a space between working bands is 50 GHz (with a wavelength space of 0.4 nm).

Usually, the SG-DBR laser device is selected, and values of the current I4 and I1 of the corresponding front mirror and rear mirror on each band are kept unchanged. The values of I1 and I4 on the corresponding 103 bands are shown in Table 1.

TABLE 1

| Channel (band) | Frequency (GHz) | I1 (mA) | I4 (mA) |
|---|---|---|---|
| 1 | 191150 | 3.3643 | 9.0043 |
| 2 | 191200 | 4.3474 | 10.6409 |
| 3 | 191250 | 5.5303 | 12.5592 |
| 4 | 191300 | 6.8563 | 14.6855 |
| 5 | 191350 | 8.4168 | 17.1299 |
| . . . | . . . | . . . | . . . |

S202. Initialize the SG-DBR laser device.

The sweeping modes of the laser device include a single-band sweep mode and a multi-band switching mode. The current I1 of the front mirror end, the current I4 of the rear mirror end, and the current I2 of the phase end can all be controlled to implement different sweep modes.

Currents of the front mirror end, the rear mirror end, and the phase end of the laser device are initialized, so that the laser device works on the initial band. In an initial state, the current I4 of the front mirror end is set to 9.0043 mA, the current I1 of the rear mirror end is set to 3.3643 mA, and the current I2 of the phase end is set to 0 mA. This state is the starting point of the laser device working in the sweep mode.

S203. When the current sweep mode of the SG-DBR laser device is a single-band sweep mode, control the laser device to perform continuous sweeping on a preset band.

The single-band sweep mode is shown in FIG. 4. Currents I1 and I4 (shown in FIG. 6) of the front mirror and rear mirror ends are maintained, and an analog current signal I2 (the triangular wave or sawtooth-shaped wave) for linear frequency modulation is input at the phase end. In addition, temperature and power feedback control ensures stable temperature and output power of the laser device. In the single-band sweep mode, the sweep frequency can reach 100 kHz (correspondingly, T1=10 µs), and the sweep bandwidth reaches 1.5 GHz (B1=1.5 GHz).

Figure 7:
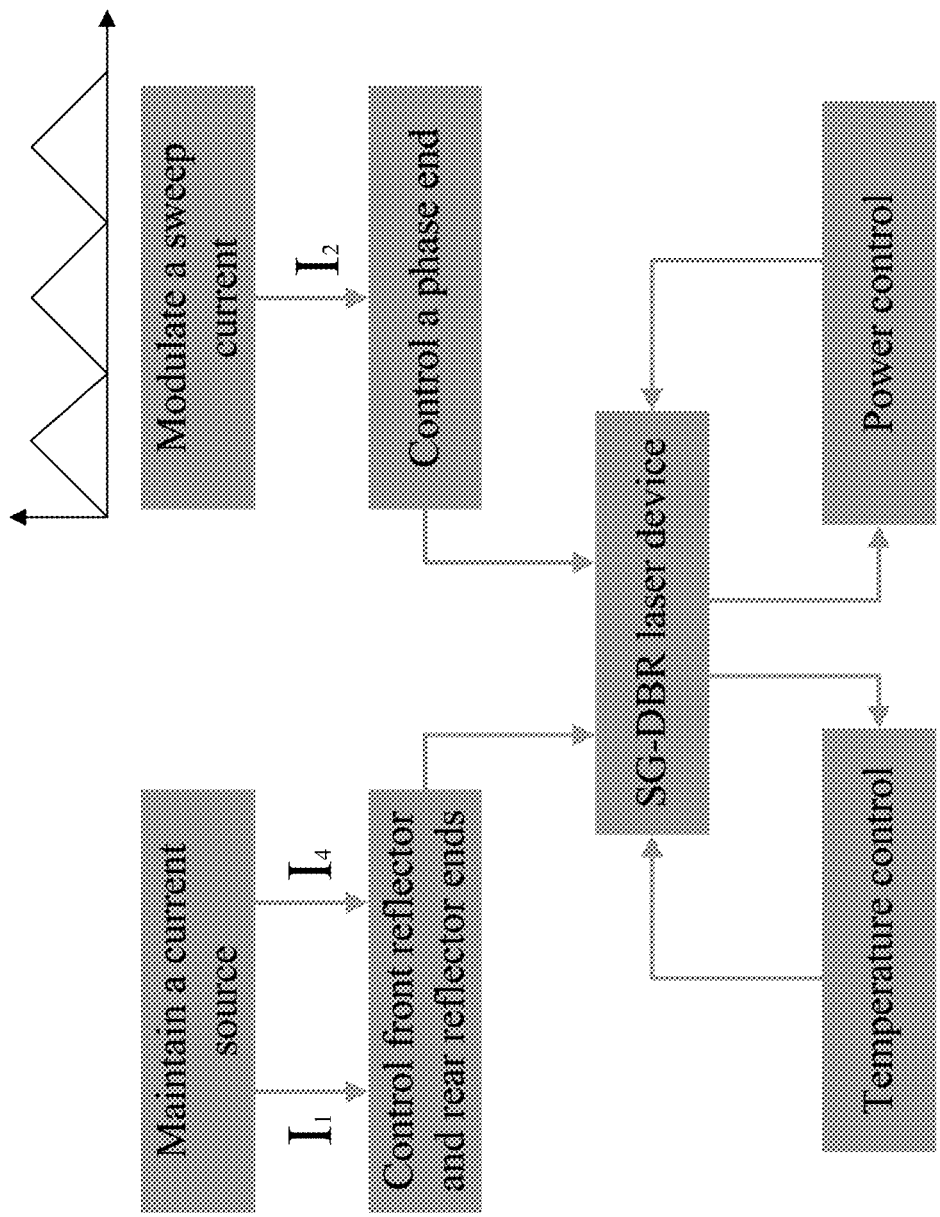
FIG. 7 is an example schematic diagram of signal control under a single-band sweep mode according to an embodiment of this application.

In a specific embodiment, as shown in FIG. 7, I4 and I1 are kept unchanged, and the analog current signal I2 for linear frequency modulation is input at the phase end. Herein, I2 is a linear wave such as the triangular wave or sawtooth-shaped wave. I4, I1, and the analog current signal I2 for linear frequency modulation are used to perform continuous linear sweeping on the current band.

S204. Through timing control, determine whether the single-band sweep mode ends, and if yes, switch to the multi-band switching mode.

As shown in FIG. 4, through timing control, it is determined whether the single-band sweep duration is greater than T2, and if yes, the single-band sweep mode is switched to the multi-band switching mode.

Figure 8:
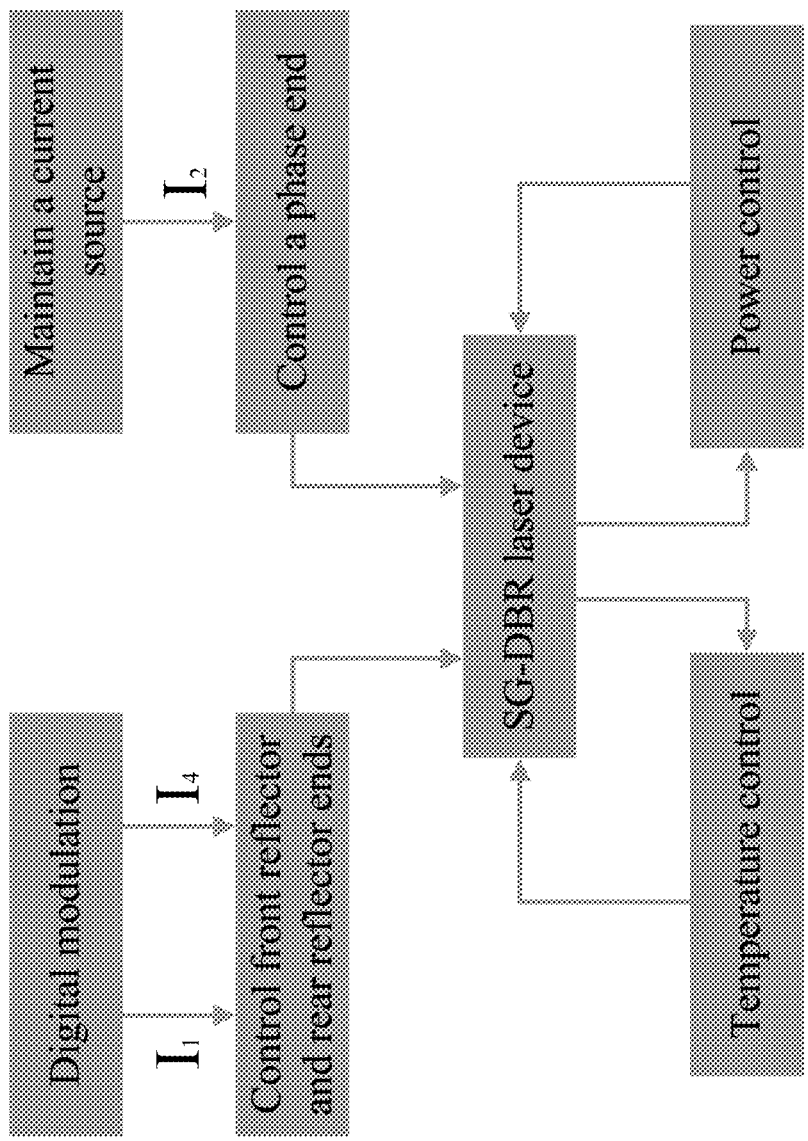
FIG. 8 is an example schematic diagram of signal control under a multi-band switching mode according to an embodiment of this application.

The multi-band switching mode is shown in FIG. 8. A value of the third current I2 of the phase end (which can be kept as 0 mA) is maintained, and currents I1 and I4 of the front mirror and rear mirror ends are controlled in a digital modulation manner, to jump from a working current on the target band (a band 1) to the working current on the next band (a band 2). In addition, temperature and power feedback control ensures stable temperature and output power of the laser device. In the working mode, the frequency output mode of the laser device is consistent with an output mode of jumping from a point P to a point Q in FIG. 4. The frequency changes by 50 GHz (that is, correspondingly, B2=50 GHz in FIG. 4) after one jumping.

There are a total of 103 bands. The frequency jumps in sequence in the foregoing manner, and a frequency modulation range is 191.15 THz to 196.15 THz (with a corresponding wavelength modulation range of 1528.38 nm to 1568.38 nm).

S205. Through timing control, determine whether the current working band is less than or equal to a maximum band, and if yes, return to S203; otherwise, return to S202.

In one or more embodiments of this application, the current sweep mode of the laser device is obtained; when the current sweep mode is a single-band sweep mode, the laser device is controlled to perform continuous sweeping on the preset band; and when the current sweep mode is a multi-band switching mode, the next band is obtained for the laser device to perform sweeping, and the laser device is controlled to switch from the band to the next band. Sweeping is performed band-by-band on multiple preset bands under joint action of the two modes. In this application, a new laser frequency modulation method (multi-band linear sweep) is designed, where the laser device performs continuous linear sweeping on a single band within a relatively small frequency range, to meet a requirement of the FMCW system for detecting a distance from a transmitting end; and the laser device switches between multiple bands, to implement relatively great frequency switching, so that an OPA can implement a relatively large scanning angle, to meet a requirement of an OPA system for implementing spatial scanning through frequency modulation. This can meet both an FMCW detection principle and an application requirement of OPA scanning, and is of great significance for applying both FMCW and OPA technologies to a LiDAR system. Therefore, when using the FMCW detection principle and the OPA scanning, the LiDAR can be completely solid-state, and a transceiver and a scanning device are easy to integrate. In this embodiment of this application, the SG-DBR laser device is used to implement continuous linear sweeping in the single-band sweep mode, and a frequency modulation speed reaches 100 kHz and the frequency modulation bandwidth reaches 1.5 GHz. In the multi-band switching mode, bands are switched, switching response time is less than 10 μs, band space is 50 GHz, 103 bands are covered, and the frequency modulation range is 191.15 THz to 196.15 THz.

Figure 9:
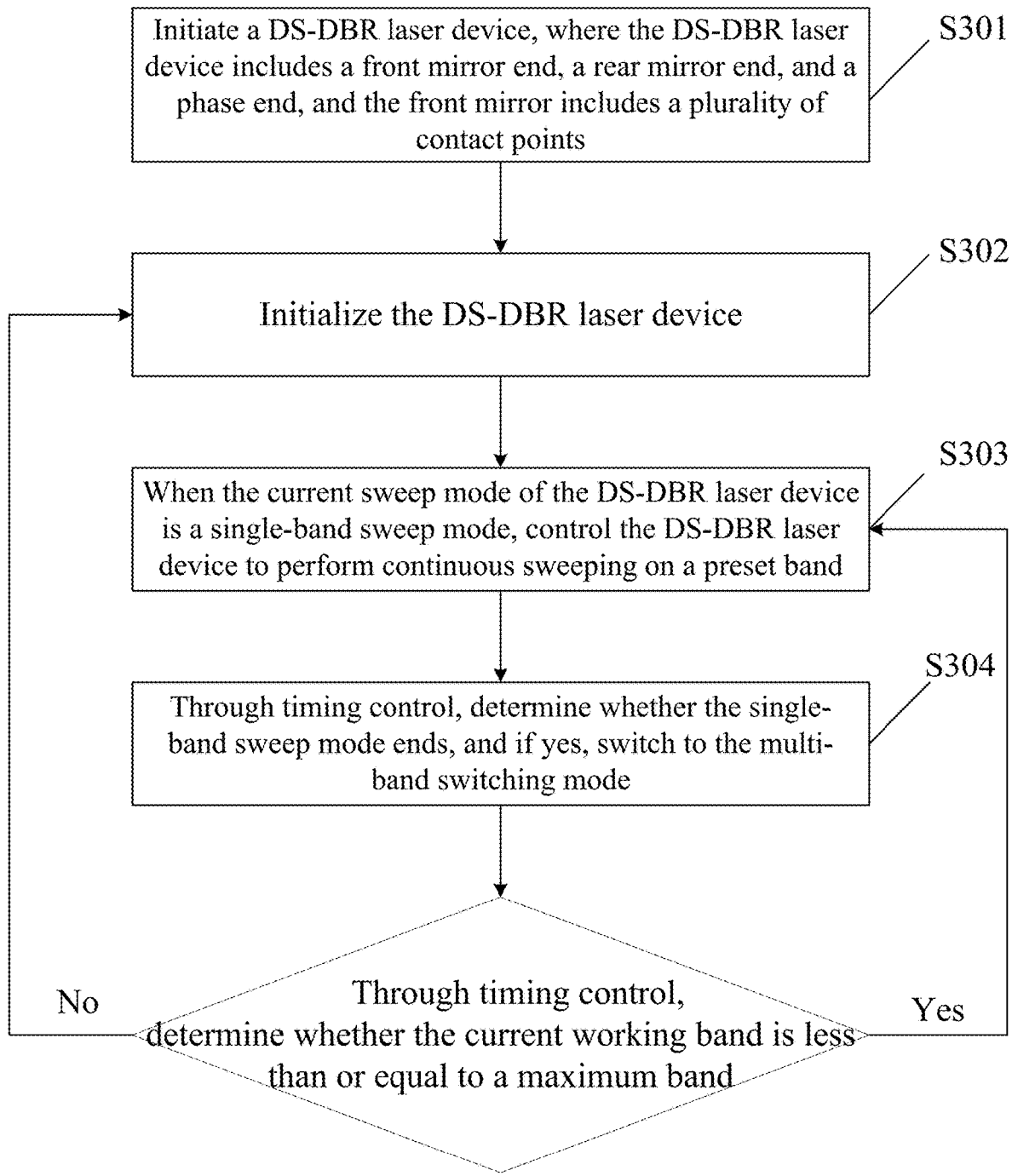
FIG. 9 is a schematic flowchart of a laser frequency modulation method according to an embodiment of this application.

FIG. 9 is a schematic flowchart of a laser frequency modulation method according to an embodiment of this application. In this embodiment, an example in which the laser frequency modulation method is applied to a digital supermode distributed Bragg reflector (DS-DBR) laser device is used for description. The laser frequency modulation method may include the following steps:

S301. Initiate a DS-DBR laser device, where the DS-DBR laser device includes a front mirror end, a rear mirror end, and a phase end, and the front mirror includes a plurality of contact points.

The laser device is a DS-DBR semiconductor laser device, which indicates that a Bragg grating serves as a reflector, a segment of doping fiber is encapsulated between two segments of Bragg gratings, and the doping fiber in the middle of the pump end is used to provide gains.

Figure 10:
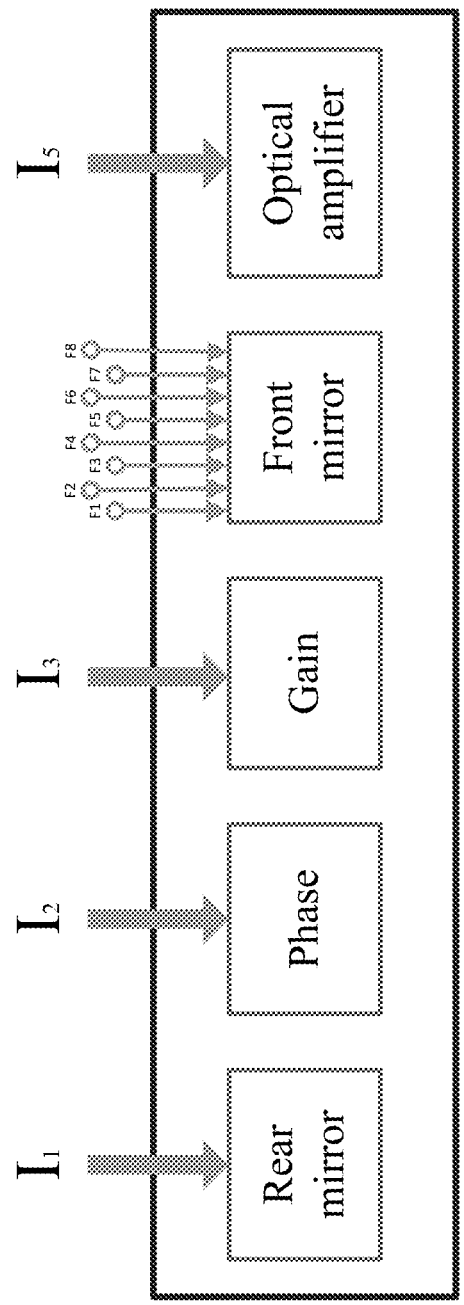
FIG. 10 is a schematic structural diagram of a main module of a DS-DBR semiconductor laser device according to an embodiment of this application.

The DS-DBR semiconductor laser device is similar to the SG-DBR semiconductor laser device, but has a different front mirror end. The front mirror end includes a single chirped grating with eight contact points F1 to F8. As shown in FIG. 10, gating of the eight contact points is used to select the working band of the laser device. Therefore, only two current sources need to be connected to a pair of adjacent contact points (for example, F1 and F2, or F2 and F3, . . . , where there are a total of seven combinations), and another unused port is grounded, thereby generating a supermode.

I1 and currents of ends F1 to F8 (two of which are selected for gating, with the others grounded) are controlled, to change the working band of the laser device, thereby implementing frequency modulation in a wide range. I1 and F1 and F2 of the different bands of the DS-DBR laser device are shown in Table 2.

TABLE 2

| Channel (band) | Frequency (GHz) | I1 (mA) | F1 (mA) | F2 (mA) |
| --- | --- | --- | --- | --- |
| 1 | 191150 | 45.29 | 4.82 | 0.68 |
| 2 | 191200 | 42.83 | 4.68 | 0.82 |
| 3 | 191250 | 40.27 | 4.28 | 1.22 |
| 4 | 191300 | 37.6 | 4.28 | 1.22 |
| 5 | 191350 | 34.45 | 4.28 | 1.22 |
| . . . | . . . | . . . | . . . | . . . |

S302. Initialize the DS-DBR laser device.

The sweeping modes of the laser device include a single-band sweep mode and a multi-band switching mode. The current I1 of the front mirror end, those of any two adjacent contact points (for example, F1 and F2) of the rear mirror end, and the current I2 of the phase end can all be controlled to implement different sweep modes.

Currents of the front mirror end, the rear mirror end, and the phase end of the laser device are initialized, so that the laser device works on the initial band. In an initial state, a current of F1 of the front mirror end is set to 4.82 mA, a current of F2 is set to 0.68 mA, the current I1 of the rear mirror end is set to 3.3643 mA, and the current I2 of the phase end is set to 0 mA. This state is the starting point of the laser device working in the sweep mode.

S303. When the current sweep mode of the DS-DBR laser device is a single-band sweep mode, control the DS-DBR laser device to perform continuous sweeping on a preset band.

The working band of the laser device is controlled to remain on the current band, two adjacent contact points are selected from the plurality of contact points, and a first current value corresponding to the two adjacent contact points and a second current value of the rear mirror end are obtained. The first current value and the second current value are maintained. The analog current signal for linear frequency modulation is input at the phase end, and then the first current value, the second current value, and the analog current signal for linear frequency modulation are used to perform continuous linear sweeping on the current band.

It should be noted that based on data in the foregoing table, combining only the first current value corresponding to F1 and F2 selected for gating with I1 can implement different bands; and similarly, combining a group of F2, F3, or another port selected for gating and the corresponding first current value with I1 can implement more bands.

Figure 11:
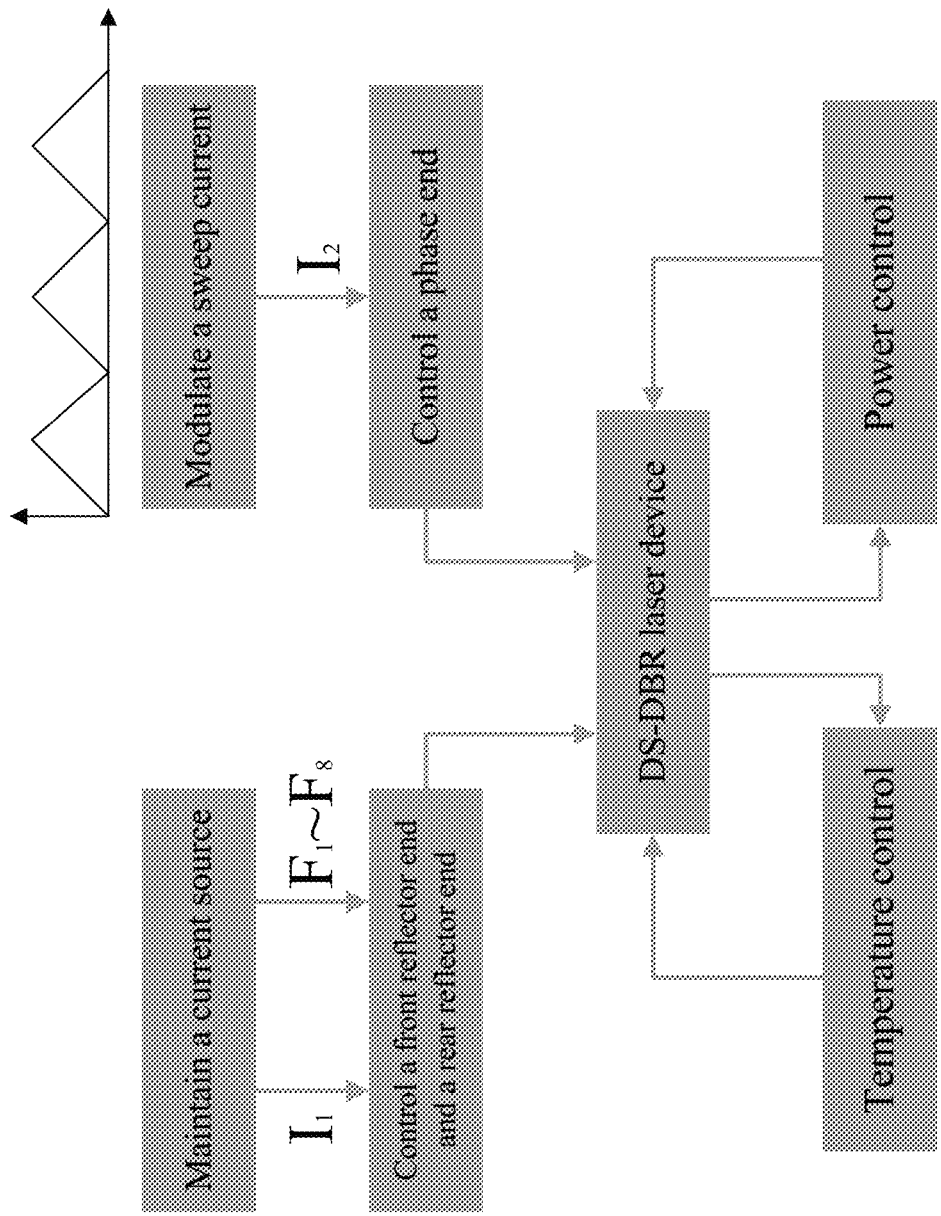
FIG. 11 is an example schematic diagram of signal control under a single-band sweep mode according to an embodiment of this application.

As shown in FIG. 11, F1 (4.28 mA), F2 (0.68 mA), and I1 (3.3643 mA) are kept unchanged, and the analog current signal I2 for linear frequency modulation is input at the phase end. Herein, I2 is a linear wave such as the triangular wave or sawtooth-shaped wave.

S304. Through timing control, determine whether the single-band sweep mode ends, and if yes, switch to the multi-band switching mode.

Specifically, a third current value of the phase end on the current band is obtained, two adjacent contact points are selected from the plurality of contact points, and a fourth current value corresponding to the two adjacent contact points on the target band and a fifth current value of the rear mirror are obtained. A sixth current value corresponding to the two adjacent contact points on the next band and a seventh current value of the rear mirror are obtained. The third current value is maintained, the front mirror is controlled to switch from the fourth current value to the sixth current value, and the rear mirror is controlled to switch from the fifth current value to the seventh current value.

If the current band is the band 1, the fourth current values F1 and F2 are equal to 4.28 mA and 0.68 mA respectively, and the fifth current value I1 is equal to 3.3643 mA.

The next band is the band 2, and the sixth current values F1 and F2 are equal to 4.68 mA and 0.82 mA respectively, and the seventh current value I1 is equal to 42.83 mA.

Figure 12:
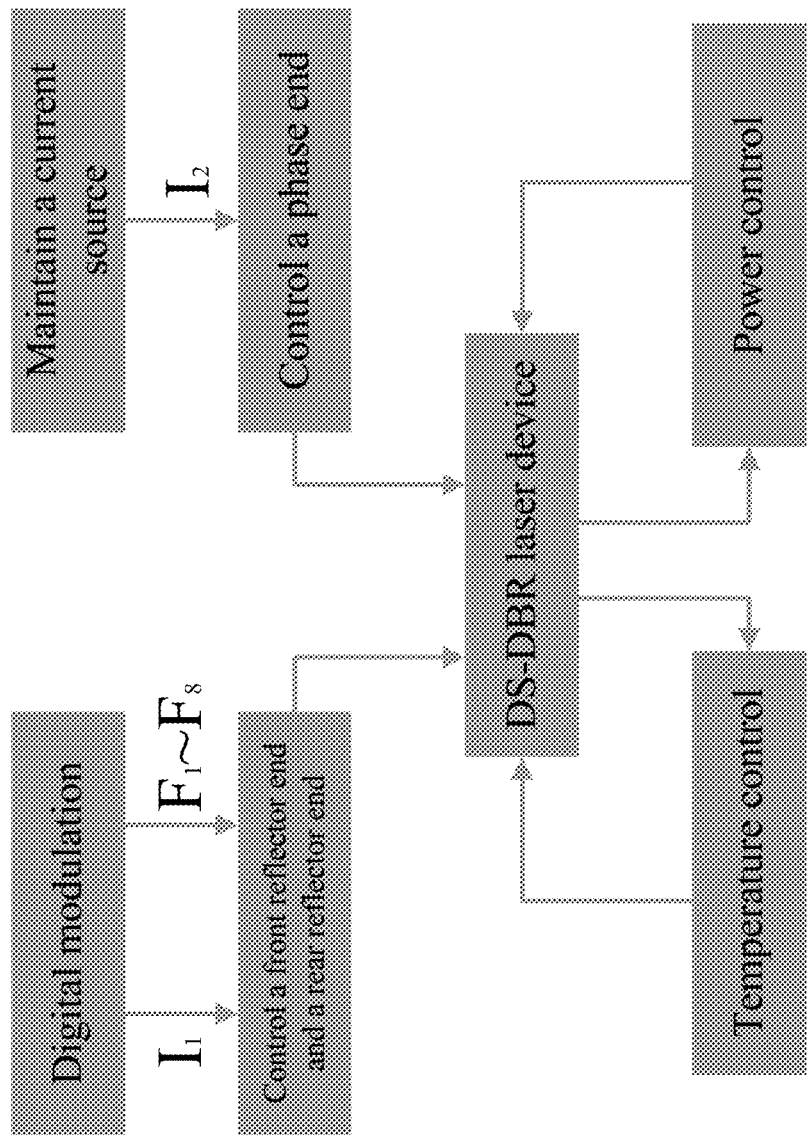
FIG. 12 is an example schematic diagram of signal control under a multi-band switching mode according to an embodiment of this application.

The multi-band switching mode is shown in FIG. 12. A value of the third current I2 of the phase end (which can be kept as 0 mA) is maintained, and the two adjacent contact points F1 and F2 in the front mirror and the current I1 of the rear mirror end are controlled in a digital modulation manner, to jump from a working current on the current band (band 1) to the working current on the next band (band 2). In addition, temperature and power feedback control ensures stable temperature and output power of the laser device.

S305. Through timing control, determine whether the current working band is less than or equal to a maximum band, and if yes, return to S203; otherwise, return to S202.

The foregoing process is repeatedly performed through the timing control, and it is determined whether the current working band reaches the maximum band. If yes, this indicates that the current sweeping is completed, and a new period of sweeping is started by initializing the laser device; otherwise, this indicates that the current sweeping is not completed, and the foregoing steps are repeatedly performed. There are a total of 103 bands. The 103th band is the maximum band. The frequency jumps in sequence in the foregoing manner, and a frequency modulation range is 191.15 THz to 196.15 THz (1528.38 nm to 1568.38 nm).

In one or more embodiments of this application, the current sweep mode of the laser device is obtained; when the current sweep mode is a single-band sweep mode, the laser device is controlled to perform continuous sweeping on the preset band; and when the current sweep mode is a multi-band switching mode, the next band is obtained for the laser device to perform sweeping, and the laser device is controlled to switch from the band to the next band. Sweeping is performed band-by-band on multiple preset bands under joint action of the two modes. In this application, a new laser frequency modulation method (multi-band linear sweep) is designed, where the laser device performs continuous linear sweeping on a single band within a relatively small frequency range, to meet a requirement of the FMCW system for detecting a distance from a transmitting end; and the laser device switches between multiple bands, to implement relatively great frequency switching, so that an OPA can implement a relatively large scanning angle, to meet a requirement of an OPA system for implementing spatial scanning through frequency modulation. This can meet both an FMCW detection principle and an application requirement of OPA scanning, and is of great significance for applying both FMCW and OPA technologies to a LiDAR system. Therefore, when using the FMCW detection principle and the OPA scanning, the LiDAR can be completely solid-state, and a transceiver and a scanning device are easy to integrate.

A device embodiment of this application is provided below, and can be used to perform the method embodiments of this application. For details not disclosed in this device embodiment of this application, refer to the method embodiments of this application.

Figure 13:
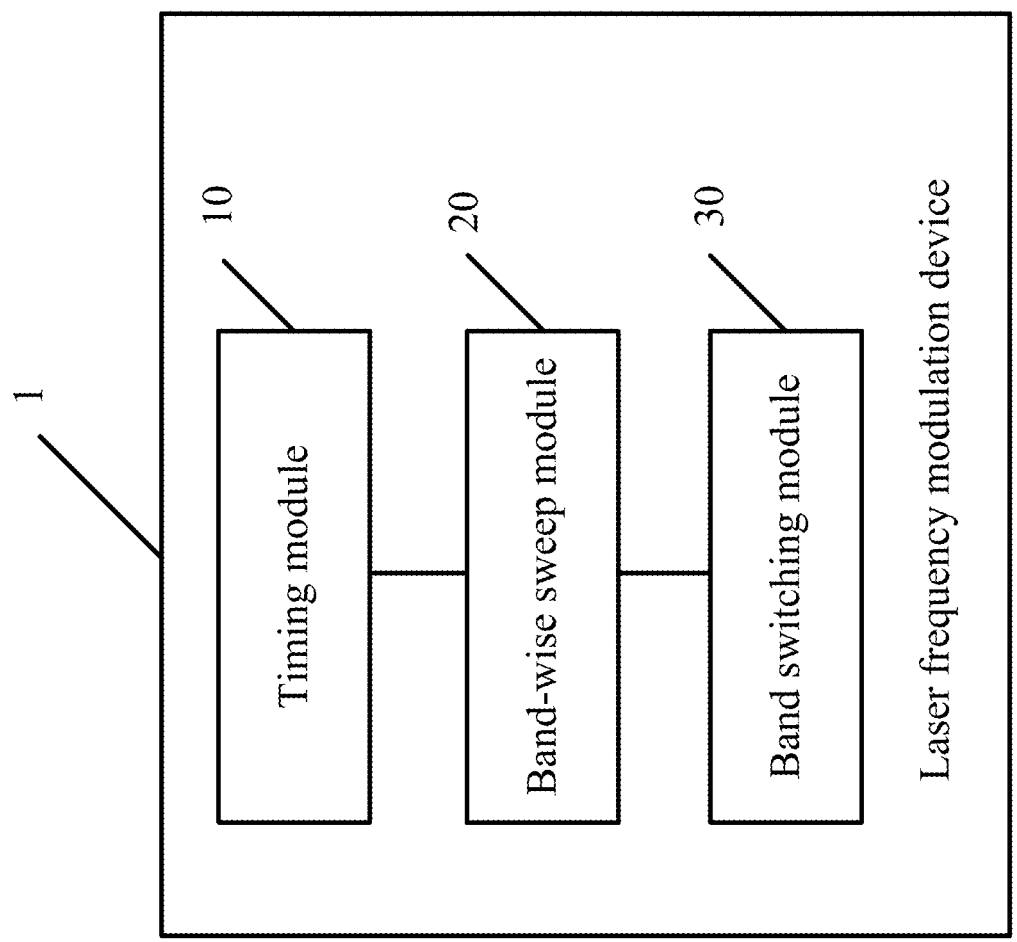
FIG. 13 is a schematic structural diagram of a laser frequency modulation device according to an embodiment of this application.

FIG. 13 is a schematic structural diagram of a laser frequency modulation device according to an example embodiment of this application. The laser frequency modulation device can be implemented as all or a part of the laser device through software, hardware or a combination thereof. The device 1 includes a timing module 10, a single-band sweep module 20, and a multi-band switching module 30.

The timing module 10 is configured to obtain a current sweep mode of a laser device in a timing manner.

The single-band sweep module 20 is configured to: when the current sweep mode is a single-band sweep mode, control the laser device to perform continuous sweeping on a preset band.

The multi-band switching module 30 is configured to: when the current sweep mode is a multi-band switching mode, obtain a next band for the laser device to perform sweeping, and control the laser device to switch from the band to the next band.

Optionally, the laser device includes a front mirror end, a rear mirror end, and a phase end, and a single-band sweep module 20 is specifically configured to: control the working band of the laser device to remain on the current band, and obtain a first current value of the front mirror end and a second current value of the rear mirror end on the current band; maintain the first current value and the second current value, and input an analog current signal for linear frequency modulation to the phase end; and perform continuous linear sweeping on the current band through the first current value, the second current value, and the analog current signal for linear frequency modulation.

Optionally, the laser device includes a front mirror end, a rear mirror end, and a phase end, and the multi-band switching module 30 is specifically configured to: obtain a third current value of the phase end, a fourth current value of the front mirror, and a fifth current value of the rear mirror on the current band; obtain a sixth current value of the front mirror and a seventh current value of the rear mirror on the next band; and maintain the third current value, control the front mirror to switch from the fourth current value to the sixth current value, and control the rear mirror to switch from the fifth current value to the seventh current value.

Optionally, the front mirror includes a plurality of contact points, and the single-band sweep module 20 is specifically configured to: select two adjacent contact points from the plurality of contact points, and obtain a first current value corresponding to the two adjacent contact points.

Optionally, the front mirror includes a plurality of contact points, and the multi-band switching module 30 is specifically configured to: select two adjacent contact points from the plurality of contact points, and obtain a fourth current value corresponding to the two adjacent contact points on the target band; and obtain a sixth current value corresponding to the two adjacent contact points on the next band.

It should be noted that, when the laser frequency modulation device provided in the foregoing embodiments performs the laser frequency modulation method, division of the foregoing functional modules is used as an example for illustration. In actual application, the foregoing functions can be allocated to different functional modules for implementation based on a requirement, that is, an inner structure of the device is divided into different functional modules to implement all or some of the functions described above. In addition, embodiments of the laser frequency modulation device and the laser frequency modulation method provided above pertain to a same concept. For a specific implementation process, refer to the method embodiments. Details are not described herein again.

Serial numbers of the embodiments of this application are only intended for description, and do not indicate advantages or disadvantages of the embodiments.

In one or more embodiments of this application, the current sweep mode of the laser device is obtained; when the current sweep mode is a single-band sweep mode, the laser device is controlled to perform continuous sweeping on the preset band; and when the current sweep mode is a multi-band switching mode, the next band is obtained for the laser device to perform sweeping, and the laser device is controlled to switch from the band to the next band. Sweeping is performed band-by-band on multiple preset bands under joint action of the two modes. In this application, a new laser frequency modulation method (multi-band linear sweep) is designed, where the laser device performs continuous linear sweeping on a single band within a relatively small frequency range, to meet a requirement of the FMCW system for detecting a distance from a transmitting end; and the laser device switches between multiple bands, to implement relatively great frequency switching, so that an OPA can implement a relatively large scanning angle, to meet a requirement of an OPA system for implementing spatial scanning through frequency modulation. This can meet both an FMCW detection principle and an application requirement of OPA scanning, and is of great significance for applying both FMCW and OPA technologies to a LiDAR system. Therefore, when using the FMCW detection principle and the OPA scanning, the LiDAR can be completely solid-state, and a transceiver and a scanning device are easy to integrate.

An embodiment of this application further provides a computer storage medium. The computer storage medium may store a plurality of instructions. The instructions are capable of being loaded by a processor to perform the foregoing application monitoring method in the embodiments shown in FIG. 1 to FIG. 12. For a specific execution process, refer to the specific description of the embodiments shown in FIG. 1 to FIG. 12. Details are not described herein again.

Figure 14:
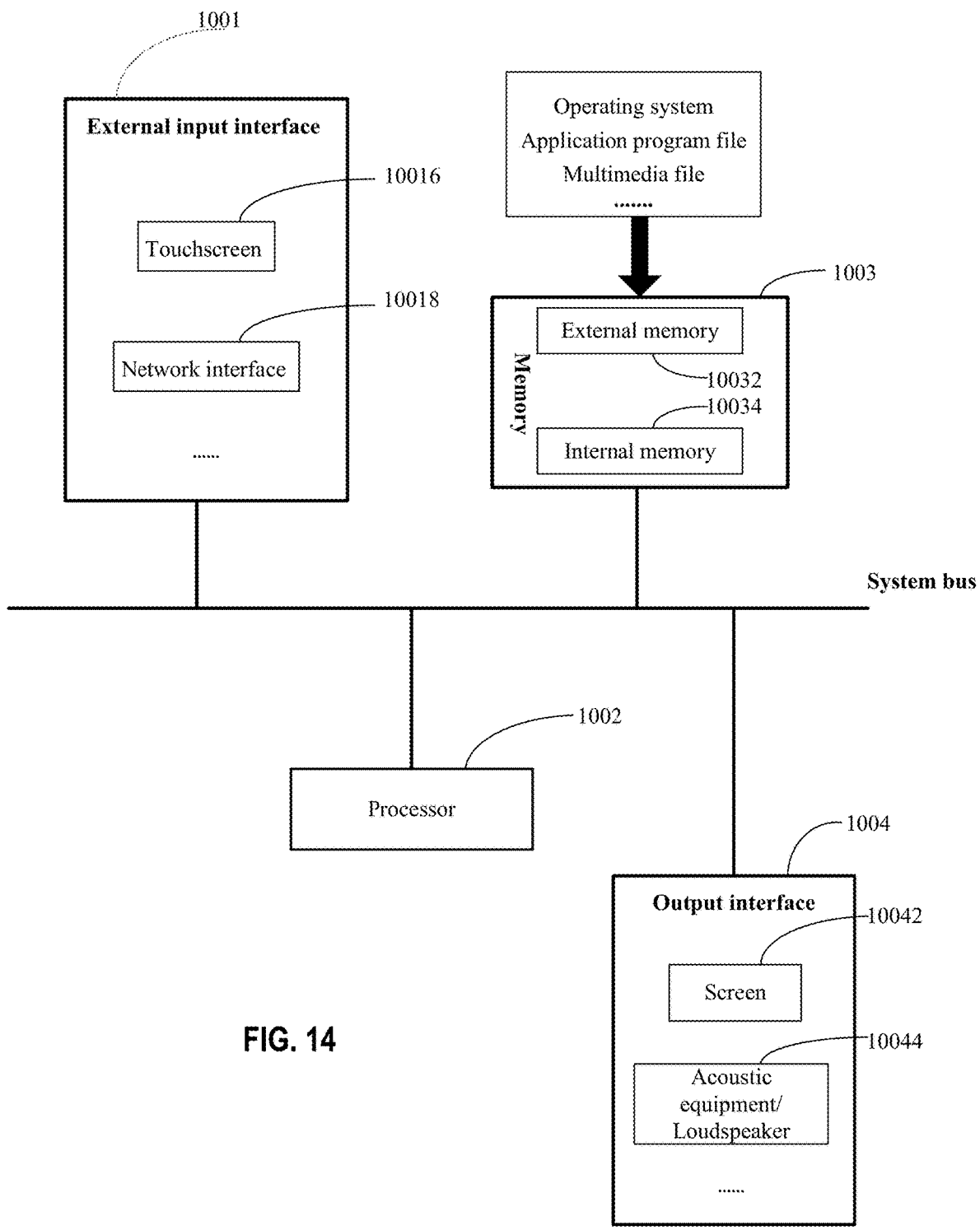
FIG. 14 is a schematic structural diagram of a laser device according to an embodiment of this application.

FIG. 14 shows a laser device 10 that can perform the foregoing laser frequency modulation method based on the von Neumann architecture. Specifically, the laser device 10 may include an external input interface 1001, a processor 1002, a memory 1003, and an output interface 1004 connected through a system bus. In addition, the external input interface 1001 may include a touchscreen 10016, and optionally may further include a network interface 10018. The memory 1003 may include an external memory 10032 (for example, a hard disk, an optical disc, or a floppy disk) and an internal memory 10034. The output interface 1004 may include devices such as a screen 10042 and an acoustic instrument/loudspeaker 10044.

In this embodiment, the method is performed based on a computer program, and a program file of the computer program is stored in the external memory 10032 of the laser frequency modulation device 1 based on the von Neumann architecture, is loaded to the internal memory 10034 when being run, and is then compiled into machine code and then transferred to the processor 1002 for execution, so that the timing module 10, the band-wise sweep module 20 and the band switching module 30 are logically formed in the laser frequency modulation device 1 based on the von Neumann architecture. In addition, in a process of performing the foregoing laser frequency modulation method, the input parameters are all received through the external input interface 1001, transferred to the memory 1003 for buffering, and then input into the processor 1002 for processing. Processed result data may be buffered in the memory 1003 for further processing, or transferred to the output interface 1004 for output.

In one or more embodiments of this application, the current sweep mode of the laser device is obtained; when the current sweep mode is a single-band sweep mode, the laser device is controlled to perform continuous sweeping on the preset band; and when the current sweep mode is a multi-band switching mode, the next band is obtained for the laser device to perform sweeping, and the laser device is controlled to switch from the band to the next band. Sweeping is performed band-by-band on multiple preset bands under joint action of the two modes. In this application, a new laser frequency modulation method (multi-band linear sweep) is designed, where the laser device performs continuous linear sweeping on a single band within a relatively small frequency range, to meet a requirement of the FMCW system for detecting a distance from a transmitting end; and the laser device switches between multiple bands, to implement relatively great frequency switching, so that an OPA can implement a relatively large scanning angle, to meet a requirement of an OPA system for implementing spatial scanning through frequency modulation. This can meet both an FMCW detection principle and an application requirement of OPA scanning, and is of great significance for applying both FMCW and OPA technologies to a LiDAR system, and therefore, when using the FMCW detection principle and the OPA scanning, the LiDAR can be completely solid-state, and a transceiver and a scanning device are easy to integrate.

A person skilled in the art can understand that all or some procedures in methods in the forgoing embodiments can be implemented by instructing relevant hardware via computer program. The program can be stored in a computer-readable storage medium. During execution, the computer program may include the procedures in the foregoing method embodiments. A storage medium can be a magnetic disk, an optical disc, a read-only storage memory, or a random storage memory, and the like.

The forgoing discloses only preferred embodiments of this application, which certainly cannot be used to limit the protection scope of this application. Therefore, equivalent changes made in accordance with the claims of this application still fall within the scope of this application.

What is claimed is:

1. A laser frequency modulation method, performed by a LiDAR using Frequency Modulated Continuous Wave (FMCW) detection and Optical Phased Array (OPA) scanning, the method comprising:
   obtaining a current sweep mode of a laser device in a timing manner, wherein the laser device comprises a front mirror end, a rear mirror end, and a phase end;
   in response to the current sweep mode being a single-band sweep mode, controlling the laser device to perform continuous sweeping on a preset band, wherein controlling the laser device to perform the continuous sweeping on the preset band comprises:
      controlling the working band of the laser device to remain on the current band, and obtaining a first current value of the front mirror end and a second current value of the rear mirror end on the current band;
      maintaining the first current value and the second current value, and inputting an analog current signal for linear frequency modulation to the phase end; and
      performing continuous linear sweeping on the current band through the first current value, the second current value, and the analog current signal for linear frequency modulation; and
   in response to the current sweep mode being a multi-band switching mode, obtaining a next band for the laser device to perform sweeping, and controlling the laser device to switch from the band to the next band,
   wherein controlling the laser device to switch from the band to the next band comprises:
      obtaining a third current value of the phase end, a fourth current value of the front mirror, and a fifth current value of the rear mirror on the current band;
      obtaining a sixth current value of the front mirror and a seventh current value of the rear mirror on the next band; and
      maintaining the third current value, controlling the front mirror to switch from the fourth current value to the sixth current value, and controlling the rear mirror to switch from the fifth current value to the seventh current value.

2. The method according to claim 1, wherein the front mirror comprises a plurality of contact points, and obtaining the first current value of the front mirror end on the target band comprises:
   selecting two adjacent contact points from the plurality of contact points, and obtaining a first current value corresponding to the two adjacent contact points.

3. The method according to claim 1, wherein the front mirror comprises a plurality of contact points, and obtaining the fourth current value of the front mirror on the target band comprises:
   selecting two adjacent contact points from the plurality of contact points, and obtaining a fourth current value corresponding to the two adjacent contact points on the target band, wherein obtaining the sixth current value of the front mirror on the next band comprises:
      obtaining a sixth current value corresponding to the two adjacent contact points on the next band.

4. A laser frequency modulation device, used for a LiDAR using Frequency Modulated Continuous Wave (FMCW) detection and Optical Phased Array (OPA) scanning, the laser frequency modulation device comprising:
   a timing module, configured to obtain a current sweep mode of a laser device in a timing manner, wherein the laser device comprises a front mirror end, a rear mirror end, and a phase end;
   a single-band sweep module, configured to: in response to the current sweep mode being a single-band sweep mode, control the laser device to perform continuous sweeping on a preset band;
   the single-band sweep module is specifically configured to:
      control the working band of the laser device to remain on the current band, and obtain a first current value of the front mirror end and a second current value of the rear mirror end on the current band;
      maintain the first current value and the second current value, and input an analog current signal for linear frequency modulation to the phase end; and
      perform continuous linear sweeping on the current band through the first current value, the second current value, and the analog current signal for linear frequency modulation; and
   a multi-band switching module, configured to: in response to the current sweep mode being a multi-band switching mode, obtain a next band for the laser device to perform sweeping, and control the laser device to switch from the band to the next band;
   the multi-band switching module is specifically configured to:
      obtain a third current value of the phase end, a fourth current value of the front minor, and a fifth current value of the rear minor on the current band;
      obtain a sixth current value of the front minor and a seventh current value of the rear mirror on the next band; and
      maintain the third current value, control the front mirror to switch from the fourth current value to the sixth current value, and control the rear mirror to switch from the fifth current value to the seventh current value.

* * * * *